US007234233B2

(12) United States Patent
Fong et al.

(10) Patent No.: US 7,234,233 B2
(45) Date of Patent: Jun. 26, 2007

(54) METHOD OF MANUFACTURING AN ELECTROMAGNETIC RELAY

(75) Inventors: Arthur Fong, Colorado Springs, CO (US); Marvin Glenn Wong, Woodland Park, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 438 days.

(21) Appl. No.: 11/013,814

(22) Filed: Dec. 16, 2004

(65) Prior Publication Data

US 2005/0134412 A1 Jun. 23, 2005

Related U.S. Application Data

(62) Division of application No. 10/413,329, filed on Apr. 14, 2003, now Pat. No. 6,838,959.

(51) Int. Cl.
*H01R 9/00* (2006.01)
*H05K 3/00* (2006.01)

(52) U.S. Cl. ......................... 29/842; 29/602.1; 29/622; 200/209; 200/210; 200/214; 335/52; 335/58; 335/60

(58) Field of Classification Search .................. 29/842, 29/602.1, 622; 200/209, 210, 214; 335/52, 335/58, 60
See application file for complete search history.

(56) References Cited

U.S. PATENT DOCUMENTS

| | | | | |
|---|---|---|---|---|
| 4,260,970 | A * | 4/1981 | Bitko | 335/52 |
| 6,515,404 | B1 * | 2/2003 | Wong | 310/328 |

* cited by examiner

*Primary Examiner*—A. Dexter Tugbang
*Assistant Examiner*—Tim Phan

(57) ABSTRACT

The present invention relates to an electrical relay in which a solid slug is moved within a channel and used to make or break an electrical connection. The solid slug is moved by electromagnets. In the preferred embodiment, the slug is wetted by a conducting liquid, such as liquid metal, that also adheres to wettable contact pads within the channel to provide a latching mechanism. The relay is amenable to manufacture by micro-machiningtechniques.

4 Claims, 4 Drawing Sheets

METHOD OF MANUFACTURING AN ELECTROMAGNETIC RELAY

This is a divisional patent application of U.S. patent application Ser. No. 10/413,329, entitled "Longitudinal Electromagnetic Latching Relay", filed Apr. 14, 2003, now U.S. Pat. No. 6,838,959, and is incorporated herein by reference.

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121 -1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020540-1, "Method and Structure for a Solid Slug Caterpillar Piezoelectric Relay", and having the same filing date as the present application;

Application 10020541 -1, titled "Method and Structure for a Solid Slug Caterpillar Piezoelectric Optical Relay", and having the same filing date as the present application;

Application 10030438-1, "Inserting-finger Liquid Metal Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

FIELD OF THE INVENTION

The invention relates to the field of electromagnetic switching relays, and in particular to an electromagnetically actuated relay that latches by means of liquid surface tension.

BACKGROUND

Latching relays are used widely in applications such as aerospace, RF communications and portable electronics. Conventional electromechanical relays operate by energizing an electromagnet that actuates a magnetic armature to make or break a contact. When the magnet is deenergized, a spring restores the armature to its original position. Similar techniques have been applied to microelectromechanical (MEMS) relays using microelectronic fabrication methods. Latching in MEMS switches is difficult to achieve. One approach uses a cantilever beam in the magnetic field of a permanent magnet. The beam is bistable; the end closer to the magnet is attracted to the magnet.

Liquid metal is also used in electrical relays. A liquid metal droplet can be moved by a variety of techniques, including electrostatic forces, variable geometry due to thermal expansion/contraction, and pressure gradients. When the dimension of interest shrinks, the surface tension of the liquid metal becomes dominant force over other forces, such as body forces (inertia). Consequently, some micro-electromechanical (MEM) systems utilize liquid metal switching.

SUMMARY

The present invention relates to an electrical relay in which a solid slug is moved within a channel and used to make or break an electrical connection. The solid slug is moved by electromagnets. In accordance with a certain embodiment, the slug is wetted by a liquid, such as liquid metal, that also adheres to wettable metal contact pads within the channel to provide a latching mechanism.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
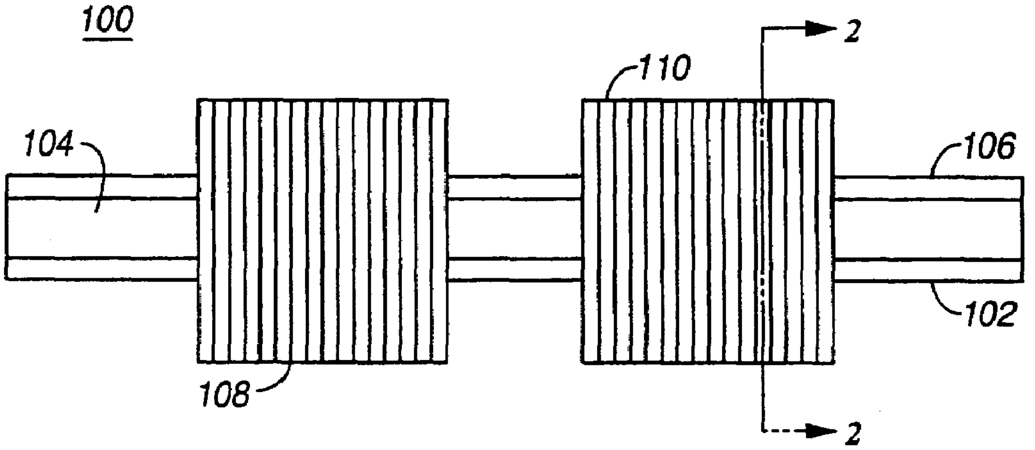
FIG. 1 is a side view of a latching relay in accordance with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to an electro-magnetically actuated latching relay that switches and latches by means of a wettable magnetic solid slug and a liquid. In the preferred embodiment, the relay uses the magnetic field of an electromagnet to displace a solid magnetic slug. The slug completes or breaks an electrical path, allowing the switching of electrical signals. In the absence of the magnetic field, the solid slug is held in place by surface tension in a liquid, preferably a liquid metal such as mercury, that wets between the solid slug and at least one fixed contact pad on the relay housing.

In one embodiment, micro-machining techniques are used to manufacture the relay. A view of a latching electrical relay 100 is shown in FIG. 1. In this embodiment, the body or housing of the relay is made up of three layers and is amenable to manufacture by micro-machining. The lowest layer is a circuit substrate 102 that will be described in more detail below with reference to FIG. 3 and FIG. 6. The next layer is a switching layer 104. The switching of the electrical signal occurs in a switching channel contained in this layer. The switching layer 104 also contains a pressure relief vent for relieving pressure variations in the switching channel. The cap layer 106 provides a seal to the top of the switching channel. Electric coils 108 and 110 encircle the relay housing and are used to actuate the switching mechanism. The section 2-2 is shown in FIG. 2.

Figure 2:
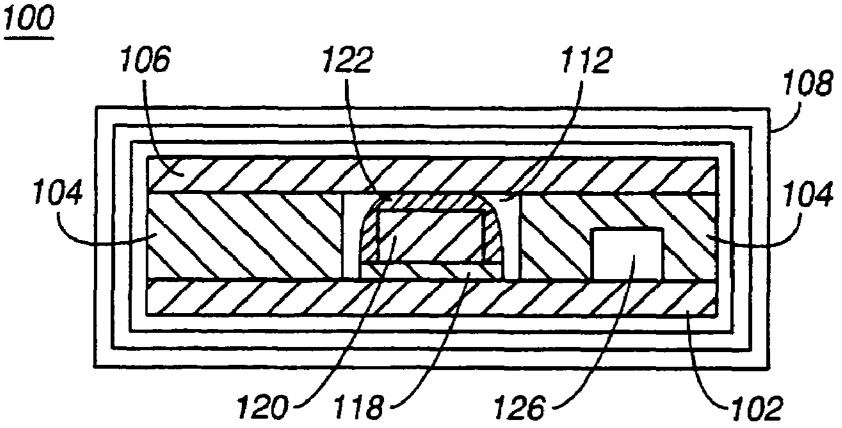
FIG. 2 is a sectional view through a latching relay in accordance with certain embodiments of the present invention.

FIG. 2 is a cross-sectional view through the section 2-2 of the relay shown in FIG. 1. The electric coil 108 encircles the relay housing. A switching channel 112 is formed in the switching layer 104. An electrical contact pad 118 is formed on the circuit substrate 102. The contact pad 118 has a surface that is wettable by a conducting liquid, such as a liquid metal. A solid slug 120 is positioned in the switching channel 112 and can be moved along the channel. Motion of the solid slug is resisted by surface tension in the conducting liquid 122. A pressure relief passage 126 is also formed in the switching channel (or in an additional layer). The pressure relief passage 126 is open to the ends of the switching channel 112 and allows gas to pass from one end of the switching channel to the other when the solid slug moves along the channel.

Figure 3:
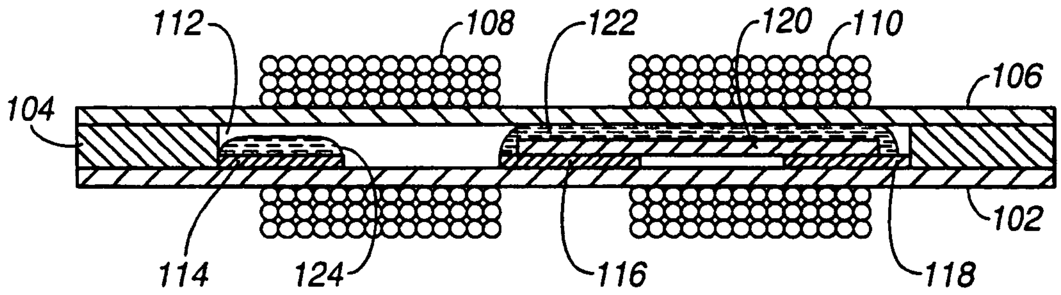
FIG. 3 is a further sectional view through a latching relay of the present invention showing a first switch-state.

A view of a longitudinal, vertical cross-section through the relay is shown in FIG. 3. A switching channel 112 is formed in the switching layer 104. A solid slug 120 is moveably positioned within the switching channel. Three contact pads 114, 116 and 118 are fixed to the circuit substrate 102 within the switching channel. These contact pads may be formed on the circuit substrate 102 by deposition or other micro-machining techniques. The contact pads are wettable by the conducting liquid 122 and 124. When the solid slug 120 is positioned as shown in FIG. 3, the liquid 122 wets the surface of the solid slug and the surface of the contact pads 116 and 118. Surface tension holds the solid slug in this position. Additional liquid 124 wets the contact pad 114.

Figure 4:
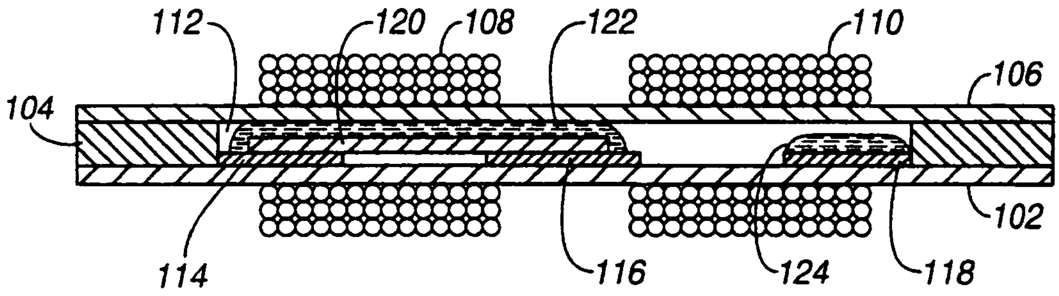
FIG. 4 is a further sectional view through a latching relay of the present invention showing a second switch-state.

When the solid slug occupies the position shown in FIG. 3, the electrical path between contact pads 116 and 118 is completed by the slug and the liquid, while the electrical path between the contact pads 114 and 116 is broken. In order to change the switch-state of the relay, the electric coil 108 is energized by passing an electrical current through it. This generates a magnetic field in the switching channel 112 and the solid slug 120 is magnetically attracted towards the energized coil 108. The surface tension latch is broken and the solid slug is drawn to the left end of the switching channel, to the position shown in FIG. 4. Referring to FIG. 4, the solid slug 120 is then in wetted contact with the contact pads 114 and 116 and completes an electrical circuit between them. The electric coil 108 may now be de-energized, since the solid slug will be held in the new position by surface tension in the liquid. Hence, the relay has been latched in its new position. In this new position, the electrical path between contact pads 114 and 116 is completed, whereas the electrical path between the contact pads 116 and 118 is broken.

The switch-state may be changed back to the original state, shown in FIG. 3, by energizing the coil 110 to move the solid slug. Once the solid slug has returned to its original position the coils may be de-energized since the slug is latched into position by surface tension in the liquid.

Figure 5:
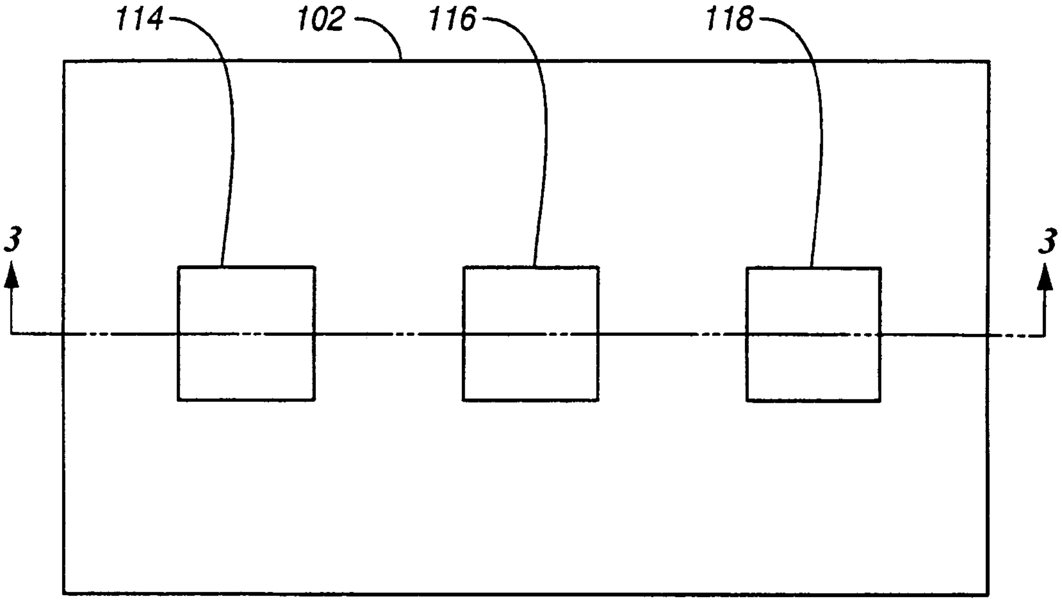
FIG. 5 is a view of a circuit substrate of a latching relay in accordance with certain embodiments of the present invention.

FIG. 5 is a top view of the circuit substrate 102. Three contact pads 114, 116 and 118 are formed on top of the substrate. The surfaces of the contact pads are wettable by the liquid in the switching channel. The contacts pads are preferably constructed of a wettable metal. Electrical conductors (not shown) are used to provide electrical connections to the contacts pads. In one embodiment, these conductors pass through vias in the circuit substrate and terminate in solder balls on the underside of the substrate. In a further embodiment, the conductors are deposited on the surface of the circuit substrate 102 and lead from the contact pads to the edge of the substrate. The section 3-3 is shown in FIG. 3.

Figure 6:
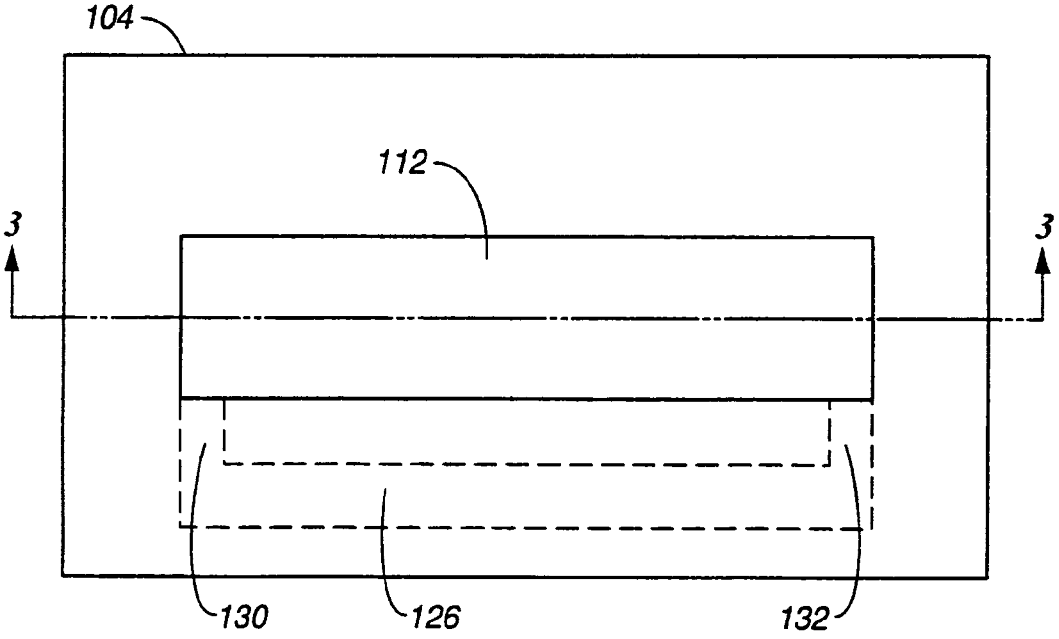
FIG. 6 is a view of a switching layer of a latching relay in accordance with certain embodiments of the present invention.

FIG. 6 is a top view of the switching layer 104. A switching channel 112 is formed in the layer. Also formed in the layer is a pressure relief passage 126 that is coupled to the switching channel 112 by vent channels 130 and 132. The vent channels may be sized and positioned to dampen the motion of the solid slug by restricting the flow of fluid through the vent channels from the switching channel. The section 3-3 is shown in FIG. 3.

Figure 7:
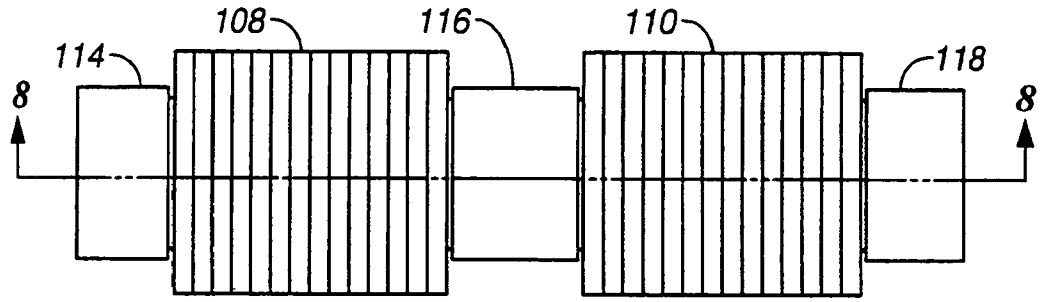
FIG. 7 is a view of a further latching relay in accordance with certain embodiments of the present invention.

FIG. 7 is a view of a further embodiment of a relay of the present invention. Electrical coils 108 and 110 surround the relay 100. Electrical contacts 114 and 118 lie at each end of the relay; contact 116 lies between the two electrical coils.

Figure 8:
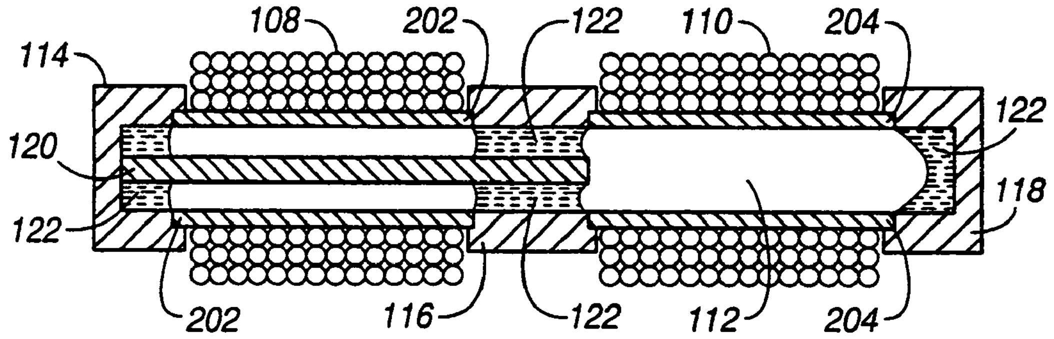
FIG. 8 is a sectional view of the further latching relay in accordance with certain embodiments of the present invention.

FIG. 8 is a sectional view through the section 8-8 of the relay in shown FIG. 7. Referring to FIG. 8, the electrical contacts 114 and 118 form the ends of a switching channel 112. Contact 116 forms the center portion of the channel. Completing the switching channel are tubes 202 and 204. The tubes 202 and 204 are made of a non-conducting, non-magnetic material, such as glass, so that the contacts are electrically isolated from one another. Within the switching channel 112 is a solid slug 120. The solid slug may be moved along the switching channel. When the solid slug is in the position shown in FIG. 8, a conducting liquid 122 connects the solid slug 120 to the contacts 114 and 116 and forms an electrical connection between the contacts. The conducting fluid also resists motion of the solid slug and so provides a latching mechanism. The switch-state of the relay is changed by energizing the electric coil 110. This generates a magnetic field within the switching channel and attracts the solid slug to the opposite end of the channel. Once the slug has been moved, the coil may be de-energized, since the solid slug is held in place by surface tension in the conducting liquid. The gas displaced when the solid slug moves blows through the conducting liquid at the center contact 116.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of manufacturing an electromagnetic relay comprising:

forming a circuit substrate layer;

forming first, second and third electrical contacts on a first surface of the circuit substrate layer, the first, second and third electrical contacts being at least partially wettable by an electrically conducting liquid;

attaching a switching layer to the first surface of the circuit substrate layer, the switching layer being aligned such that first, second and third electrical contacts are positioned in a switching channel in the switching layer;

positioning a moveable solid slug within the switching channel, the solid slug being at least partially wettable by an electrically conducting liquid;

placing an electrically conducting liquid in the switching channel such that the electrically conducting liquid wets the first, second and third electrical contacts and the solid slug;

attaching a cap layer to the switching layer, such that the electrically conducting liquid and the solid slug are retained within the switching channel;

positioning a first electromagnetic actuator in proximity to the switching channel such that it is operable to move the solid slug to a first position where it is in wetted contact with the first and third contacts; and positioning a second electromagnetic actuator in proximity to the switching channel such that it is operable to move the solid slug to a second position where it is in wetted contact with the second and third contacts.

2. The method in accordance with claim 1, further comprising forming electrical connections to the first, second and third electrical contacts on the first surface of the circuit substrate layer.

3. The method in accordance with claim 1, further comprising:

forming vias in the circuit substrate layer; and forming electrical connections to the first, second and third electrical contacts that pass through the vias in the circuit substrate layer and terminate on a second surface of the circuit substrate layer.

4. The method in accordance with claim 1, further comprising forming a pressure relief channel in the switching layer, the pressure relief channel opening to the ends of the switching channel.

* * * * *